United States Patent
Mekala et al.

(10) Patent No.: US 12,072,299 B2
(45) Date of Patent: Aug. 27, 2024

(54) SYSTEMS AND METHODS FOR SYNTHESIZING A DIAMOND USING MACHINE LEARNING

(71) Applicants: FRAUNHOFER USA, INC., Plymouth, MI (US); UNIVERSITY OF MARYLAND, COLLEGE PARK, College Park, MD (US)

(72) Inventors: Rohan Reddy Mekala, Silver Spring, MD (US); Matthias Muehle, Haslett, MI (US); Adam Porter, Washington, DC (US); Mikael Lindvall, Greenbelt, MD (US); Michael Becker, East Lansing, MI (US)

(73) Assignees: FRAUNHOFER USA, INC., Plymouth, MI (US); UNIVERSITY OF MARYLAND, COLLEGE PARK, College Park, MD (US)

(*) Notice: Subject to any disclaimer, the term of this patent is extended or adjusted under 35 U.S.C. 154(b) by 0 days.

(21) Appl. No.: 18/220,150

(22) Filed: Jul. 10, 2023

(65) Prior Publication Data
US 2023/0349835 A1    Nov. 2, 2023

Related U.S. Application Data

(63) Continuation of application No. 17/327,456, filed on May 21, 2021, now Pat. No. 11,698,347.
(Continued)

(51) Int. Cl.
  *G01N 21/88*    (2006.01)
  *G01N 21/956*    (2006.01)
(Continued)

(52) U.S. Cl.
  CPC ..... *G01N 21/8851* (2013.01); *G01N 21/8803* (2013.01); *G01N 21/95607* (2013.01);
(Continued)

(58) Field of Classification Search
  CPC ......... G01N 33/54306; G01N 33/5302; G01N 23/225; G01N 21/6452; G01N 21/6458;
(Continued)

(56) References Cited

U.S. PATENT DOCUMENTS 4,634,490 A * 1/1987 Tatsumi .................. C30B 15/26
                                                                                     117/14
5,871,805 A    2/1999 Lemelson
(Continued)

FOREIGN PATENT DOCUMENTS

BE    1024038 A1    10/2017
CN    106770675 A    5/2017
(Continued)

OTHER PUBLICATIONS

First Office Action on Chinese Patent Application No. 202180042805.0 dated Sep. 16, 2023 (14 pages incl. English translation).
(Continued)

*Primary Examiner* — Michael P Stafira
(74) *Attorney, Agent, or Firm* — FOLEY & LARDNER LLP

(57) ABSTRACT

Disclosed herein are systems and methods for synthesizing a diamond using a diamond synthesis machine. A processor receives a plurality of images of a diamond during synthesis within a diamond synthesis machine, each of the plurality of images captured within a time period. The processor executes a diamond state prediction machine learning model using the plurality of images to obtain a predicted data object, the predicted data object indicating a predicted state of the diamond within the diamond synthesis machine at a
(Continued)

time subsequent to the time period. The processor detects a predicted defect, a number of defects, defect types, and/or sub-features of such defects and/or other characteristics (e.g., a predicted shape, size, and/or other properties of predicted contours for the diamond and/or pocket holder) of the predicted state of the diamond. The processor adjusts operation of the diamond synthesis machine.

20 Claims, 8 Drawing Sheets

Related U.S. Application Data

(60) Provisional application No. 63/029,177, filed on May 22, 2020.

(51) Int. Cl.
*G06T 5/50* (2006.01)
*G06T 7/00* (2017.01)
*G06T 7/564* (2017.01)

(52) U.S. Cl.
CPC ............. *G06T 5/50* (2013.01); *G06T 7/0004* (2013.01); *G06T 7/564* (2017.01); *G01N 2021/8854* (2013.01); *G01N 2021/8887* (2013.01); *G01N 2021/95615* (2013.01)

(58) Field of Classification Search
CPC .... G01N 23/04; G01N 23/044; G01N 23/083; G01N 27/308; G01N 2021/6484; G01N 2035/1037; G01N 33/54366; G01N 35/1074; G01N 33/54373; G01N 33/6842; G01N 27/4146; G01N 33/5306; G01N 33/6854; G01N 1/2813; G01N 1/30; G01N 2021/1765; G01N 21/8483; G01N 33/542; G01N 15/1484; G01N 2015/012; G01N 2015/016; G01N 2015/018; G01N 2015/1486; G01N 2021/6439; G01N 2021/6482; G01N 21/658; G01N 21/69; G01N 21/76; G01N 33/487; G01N 33/48728; G01N 33/49; G01N 33/543; G01N 33/54346; G01N 35/00029; G01N 35/00871; G01N 2021/6419; G01N 2021/6441; G01N 21/553; G01N 21/6428; G01N 21/78; G01N 21/87; G01N 33/5438; G01N 33/561; G01N 33/569; G01N 15/01; G01N 15/06; G01N 15/0612; G01N 2015/0687; G01N 2021/6413; G01N 2021/7773; G01N 2021/8841; G01N 2021/8887; G01N 21/17; G01N 21/25; G01N 21/554; G01N 21/64; G01N 21/6408; G01N 21/6456; G01N 21/6489; G01N 21/8851; G01N 2201/1296; G01N 23/2204; G01N 2333/4737; G01N 2333/525; G01N 2333/5412; G01N 2470/06; G01N 2570/00; G01N 27/3271; G01N 27/3278; G01N 2800/24; G01N 2800/245; G01N 33/5094; G01N 33/531; G01N 33/54353; G01N 33/54386; G01N 33/553; G01N 33/68; G01N 33/6803; G01N 33/6845; G01N 33/6863
See application file for complete search history.

(56) References Cited

U.S. PATENT DOCUMENTS

| | | | |
|---|---|---|---|
| 7,336,347 B2 | 2/2008 | Sasian et al. | |
| 9,247,213 B2 * | 1/2016 | Aono | .................. G01N 21/9515 |
| 2001/0044029 A1 | 11/2001 | Fujii et al. | |
| 2007/0186918 A1 | 8/2007 | Ceulemans | |
| 2008/0231833 A1 | 9/2008 | Shlezinger et al. | |
| 2010/0250201 A1 * | 9/2010 | Sivovolenko | .......... G01N 21/88 703/1 |
| 2012/0274751 A1 | 11/2012 | Smith et al. | |
| 2014/0107986 A1 | 4/2014 | Sivovolenko | |
| 2019/0147577 A1 * | 5/2019 | Lee | .................... G01N 21/9501 382/149 |
| 2019/0211473 A1 | 7/2019 | Twitchen et al. | |
| 2020/0012962 A1 | 1/2020 | Dent et al. | |

FOREIGN PATENT DOCUMENTS

| | | | | |
|---|---|---|---|---|
| CN | 109338456 A | * | 2/2019 | |
| CN | 109993734 A | | 7/2019 | |
| CN | 110760816 A | * | 2/2020 | |
| CN | 110917998 A | * | 3/2020 | |
| CN | 112444516 A | * | 3/2021 | ............. C30B 15/20 |
| JP | H10-310489 A | | 11/1998 | |
| JP | H11-116387 | | 4/1999 | |
| RU | 2161093 C2 | | 12/2000 | |
| WO | WO-2005/048764 A1 | | 6/2005 | |
| WO | WO-2009/073576 A2 | | 6/2009 | |
| WO | WO-2018/224792 A1 | | 12/2018 | |

OTHER PUBLICATIONS

Extended European Search Report dated Nov. 7, 2023 on EPO Appl. 21807787.3 (8 pages).
First Examination Report on IN App. 202247073670 dated Mar. 9, 2023 (5 pages).
International Search Report for PCT/US2021/033632 dated Aug. 24, 2021 (15 pages).
Notice of Allowance on U.S. Appl. No. 17/327,456 dated Mar. 1, 2023 (8 pages).

\* cited by examiner

SYSTEMS AND METHODS FOR SYNTHESIZING A DIAMOND USING MACHINE LEARNING

CROSS REFERENCE TO RELATED APPLICATIONS

This application claims the benefit of priority as a continuation to U.S. application Ser. No. 17/327,456, filed May 21, 2021, which claims the benefit of priority to U.S. Provisional Patent Application No. 63/029,177, filed May 22, 2020, the entirety of each of which is incorporated herein by reference for all purposes.

TECHNICAL FIELD

The present disclosure generally relates to an artificial intelligence-based algorithm and more particularly to a machine learning approach for isolating intrinsic features and predicting diamond crystal growth states for diamond synthesis and any byproduct of such crystal growth (e.g., polycrystalline diamond growth).

BACKGROUND

Chemical vapor deposition (CVD) of diamond is the accepted manufacturing method to produce diamond for gemstones as well as electronic, optical, and quantum devices, and therefore the most applicable method for large-scale production. However, the adoption of diamond in commercial markets has been hampered by slow development toward large-scale synthesis. Generally, CVD is also employed in large-scale synthesis of semiconductor material including polycrystalline Si for the photovoltaics market, and SiC and GaN for electronics. As of 2018, sales revenue in the semiconductor market generated over $480 billion spanning industries such as consumer electronics, telecommunications, defense, and computing. CVD systems for these materials require control of numerous, time-dependent, process parameters of the growing crystal.

Current approaches to manufacturing and producing diamonds using diamond synthesis methods rely on a reactive "guess-and-check" approach. A technician may cause a diamond to grow using a diamond synthesis machine and evaluate the diamond after the diamond has been in the machine for a predetermined amount of time or has grown to a predetermined size. The technician may look for defects in the diamond and mark down their findings to indicate whether there was a defect, different characteristics about the defect, and the settings that the diamond synthesis machine used to grow the diamond that resulted in the diamond having a defect. In some cases, the technician may also determine if the diamond is a desired shape and/or size. For each defect or incorrect size or shape, the technician may determine new settings for the machine for the next attempt to grow a diamond in an attempt to grow a diamond without any defects and have the correct size or shape. Because growing a single diamond can take weeks, this reactive-based approach can require a large number of person-hours to test different operating parameters to eventually find parameters that will result in a diamond without any defects and have the correct size and shape. Further, because of the large number of diamond characteristics that can impact whether a diamond will have a defect, when growing diamonds it can be difficult to account for every permutation of diamond characteristics, which may cause the optimal operating parameters for synthesizing one diamond to be completely different from the optimal operating parameters of another diamond.

SUMMARY

For the aforementioned reasons, there is a desire for a system that can use an automated technique to avoid defects in diamonds before they occur, thus avoiding using guess-and-check methods that often result in material waste as technicians attempt to find the correct parameters for diamond synthesis. Technicians may attempt to watch the diamonds as they are being synthesized, but given the often small size of defects that may appear in diamonds as well as the unpredictable times during synthesis at which they are likely to appear, it can be difficult to predict whether diamonds being synthesized currently have any defects, let alone whether they will have any defects later on during the synthesis process. Further, technicians may wish to be able to predict final diamond dimensions (e.g., lateral dimensions) and any crystallization that may occur as diamonds are synthesized so they can control or adjust the operating parameters of a diamond synthesis machine as it synthesizes diamonds to desired dimensions (or a desired amount of crystallization). Thus, there is a need to be able to predict in real-time whether a diamond being synthesized will ever have any defects or whether the diamonds will have a predetermined set of dimensions or amount of crystallization so a system can automatically adjust the operating parameters of a diamond synthesis machine to stop the diamond from having a defect or having undesirable dimensions or amounts of crystallization in the first place.

To overcome these technical deficiencies, it is desirable to use a series of machine learning models to capture time series images (e.g., optical or thermal images) of a diamond during synthesis by a diamond synthesis machine and predict how the diamond will grow during future synthesis time-steps. A system may execute a machine learning model using a sequence of images of a diamond captured during synthesis as input to predict images of the diamond at one or more time-steps into the future. Because the growth of the diamond may depend on the diamond's state in a previous time-step (e.g., the diamond's size and shape in another predicted image), the machine learning model (e.g., a machine learning model that implements sequence learning such as a network architecture comprising units for long short-term memory networks) may predict the final state of the diamond in a predicted image or data object based on predicted images or data objects of the diamond of previously predicted time-steps. The system can evaluate the final predicted image or data object to determine if there are any defects or other problems (e.g., a diamond with undesired dimensions) in the predicted image or data object and adjust or prescribe optimal operating parameters (e.g., temperature and/or pressure) of the diamond synthesis machine after determining the current operating parameters would result in synthesis of a defective diamond or a diamond with undesired dimensions. In some instances, an operator may replace the diamond that was initially placed in the diamond synthesis machine for synthesis with another diamond seed after the system determines the diamond seed being synthesized may result in a diamond with a defect or sub-optimal dimensions. The system may periodically perform this process while the diamond is being synthesized until predicting an image in which the diamond does not have any defects, thus enabling a system for guided diamond synthesis.

The guided or automated system may enable the diamond synthesis machine to synthesize diamonds of any size and/or any shape, including diamonds with characteristics that have not yet been evaluated, which may be especially useful in growing larger diamonds for which defects are more likely to occur. Thus, the systems and methods provided herein may completely avoid the guess-and-check method of identifying the proper parameters for diamond synthesis and instead use a guided approach that enables the diamond synthesis machine to reduce the number of defects that appear in the diamond, to create a defectless diamond, to enable the diamond synthesis machine to synthesize a diamond with an optimal size and/or shape, and/or to optimize the amount of polycrystalline diamond that grows alongside the diamond during synthesis.

In one embodiment, a method for synthesizing a diamond using a diamond synthesis machine comprises receiving, by a processor, a plurality of images of a diamond during synthesis within a diamond synthesis machine, each of the plurality of images captured within a time period; executing, by the processor, a diamond state prediction machine learning model using the plurality of images to obtain a predicted data object, the predicted data object indicating a predicted state of the diamond within the diamond synthesis machine at a time subsequent to the time period; detecting, by the processor, a predicted defect in the diamond based on the predicted state of the diamond; and adjusting, by the processor, operation of the diamond synthesis machine responsive to detecting the defect.

In another embodiment, a system for synthesizing a diamond using a diamond synthesis machine comprises a processor configured to execute instructions stored on a non-transitory computer-readable medium to: receive a plurality of images of a diamond during synthesis within a diamond synthesis machine, each of the plurality of images captured within a time period; execute a diamond state prediction machine learning model using the plurality of images to obtain a predicted data object, the predicted data object indicating a predicted state of the diamond within the diamond synthesis machine at a time subsequent to the time period; detect a predicted defect in the diamond based on the predicted state of the diamond; and adjust operation of the diamond synthesis machine responsive to detecting the defect.

In further embodiments, the processor may be further configured to detect the shape and/or size properties of a synthesized diamond. The processor may be configured to determine the shape and/or size of the diamond based on contours of the predicted data object (e.g., contours in a predicted image data object) that are output by a segmentation machine learning model that processes the predicted data object. The processor may be configured to compare the contour to a set of rules and, upon determining the contours satisfy at least one rule, adjust operation of the diamond synthesis machine based on the satisfied at least one rule.

In yet another embodiment, a method for detecting defects in a diamond comprises receiving, by a processor, a plurality of images of a diamond during synthesis within a diamond synthesis machine, each of the plurality of images captured within a time period; executing, by the processor, a diamond state prediction machine learning model using the plurality of images to obtain a predicted data object, the predicted data object indicating a predicted state of the diamond within the diamond synthesis machine at a time subsequent to the time period, wherein the diamond state prediction machine learning model is trained based on a chronological series of images corresponding to a set of images of previously synthesized diamonds; detecting, by the processor, a predicted defect in the diamond based on the predicted state of the diamond; and responsive to detecting the defect, transmitting, by the processor, a signal to a second processor, the signal comprising an indication of the detected defect.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure.

DETAILED DESCRIPTION

Figure 1:
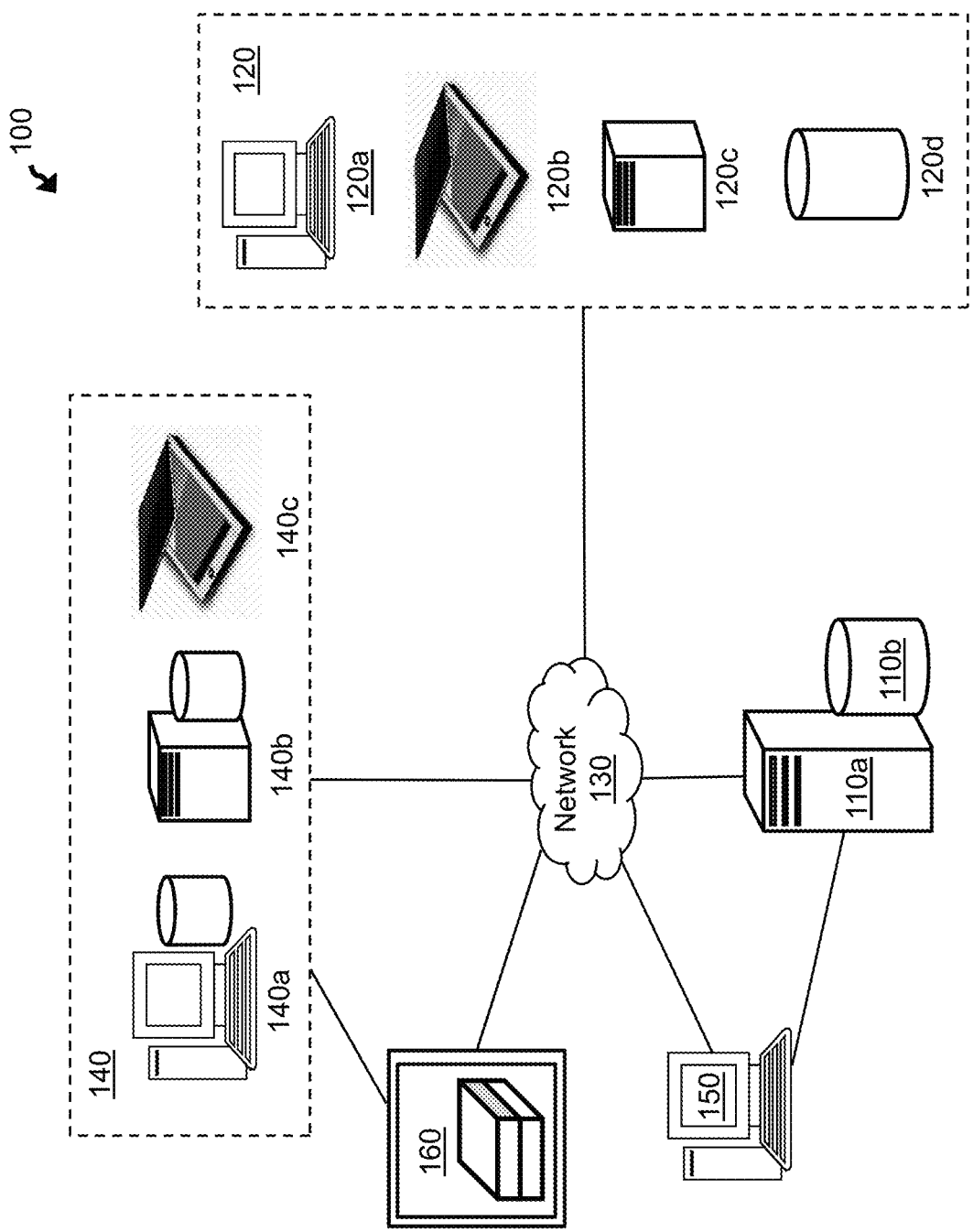
FIG. 1 illustrates components of a diamond synthesis system, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Current approaches to manufacturing and producing diamonds using diamond synthesis methods rely on a reactive guess-and-check approach. Given the large number of parameters that can be input into a diamond synthesis machine to synthesize a diamond and the generally unpredictable growth patterns of diamonds as they grow from a diamond seed, it can be extremely difficult to determine which operating parameters to use to synthesize a diamond and whether to make any adjustments to optimize the diamond's growth pattern. Instead, technicians often just input a set of parameters that they believe will make the fully synthesized diamond "close enough" and use their own perception to determine when to stop synthesizing the diamond. Because it may take weeks to synthesize a diamond, it can take thousands of person-hours to determine operating parameters to use to synthesize a diamond to reach a generally desired state (e.g., size, shape, and number of defects). Further, even after determining such parameters that will enable the system to generate a desired diamond from a diamond seed that has a specific set of characteristics, because diamond growth during synthesis may be a stochastic process, a technician may have to repeat the process for diamond seeds with other sets of characteristics. Given the large number of permutations of diamond characteristics, there is need for a system that can synthesize diamonds in real-time and account for characteristics that the system has not yet encountered to save time, money, and raw materials that may be lost in experimenting to find the optimal operating parameters for synthesis.

By implementing the systems and methods described herein, a system may resolve the aforementioned diamond synthesis deficiencies by removing the need to use a guess-and-check approach. Instead, the system may use time series image data captured during synthesis and a series of machine learning models to predict how a diamond will grow at various times throughout its synthesis period. The system may use machine learning models (e.g., architectures with components similar to a network architecture comprising units for long short-term memory networks, its variants, and other alternatives) that can predict states of the diamond at one or more time-steps and use information from the previous predicted time-step to predict the state of the diamond in the next time-step. The system may evaluate the predicted growth states of the diamond at each time-step during the synthesis period to determine whether the diamond synthesis machine's operating parameters need to be adjusted to improve the make-up of the final diamond (e.g., remove possible defects that may appear in the diamond at the end of the synthesis process, improve the diamond's shape and/or size characteristics, increase the amount of polycrystalline diamond that is formed alongside the diamond, etc.). If the system identifies any predicted defects in the diamond, the system may generate and transmit operating parameters to the diamond synthesis machine to adjust its operation and repeat the process until the system predicts that the final diamond will not have any defects, or until the synthesis period ends.

Advantageously, by implementing the systems and methods described herein, a system may implement a guided method for using a diamond synthesis machine to synthesize a diamond to create a diamond with fewer defects and/or that has a more optimal shape and/or size characteristics. Moreover, the solution may enable the system to synthesize a diamond to have fewer defects and more optimal characteristics regardless of the characteristics of the diamond's diamond seed or any changes in the diamond's composition that the diamond develops during synthesis. Thus, the system may avoid testing operating parameters for every permutation of diamond characteristics while improving the quality of the synthetic diamond that the diamond synthesis machine produces.

As will be described below, a server (referred to herein as an analytics server) can receive time series images (e.g., sequential images, in some cases associated with time-stamps) of a diamond during synthesis in a diamond synthesis machine and use machine learning techniques to predict an image or another data object (e.g., a value or vector) depicting what the diamond will look like or indicating a predicted state (e.g., size and/or shape) of the diamond after it is synthesized for a pre-determined time period or a number of time-steps. The server can analyze the predicted image or data object to determine if there are any defects in the predicted diamond or the predicted state of the diamond or whether the diamond will grow to an undesirable shape or size and make any adjustments to the diamond synthesis machine (e.g., changes in operating parameters) that may help avoid the predicted defect or the undesirable shape or size. In a non-limiting example, the server may obtain a time series of images of a diamond during synthesis within a diamond synthesis machine. The server may use the time series of images as input into a machine learning model to obtain predicted images or data objects of the diamond for a predetermined number of time-steps, where the machine learning model iteratively predicts the diamond's state at each of the time-steps and uses the predictions for previous time-steps to predict the diamond's state at the following time-step. The server may evaluate the final image or data object either using a set of rules or another machine learning model to determine if the diamond will have a defect or will be an undesirable size or shape. If the server detects a defect or an undesirable size or shape in the depicted diamond or the predicted state of the diamond, the server may send instructions to the diamond synthesis machine to change the machine's operation in an attempt to avoid the defect or undesirable size or shape. The server may repeat the process until obtaining a prediction that the diamond will not have a defect upon completion and/or will have a desirable shape and/or size, thus enabling a method for guided diamond synthesis. FIG. 1 is a non-limiting example of components of a system in which the analytics server operates.

FIG. 1 illustrates components of a diamond synthesis system 100. The system 100 may include an analytics server 110a, a system database 110b, electronic data sources 120a-d (collectively electronic data sources 120), end-user devices 140a-c (collectively end-user devices 140), and an administrator computing device 150. The above-mentioned components may be connected to each other through a network 130. Examples of the network 130 may include, but are not limited to, private or public LAN, WLAN, MAN, WAN, and the Internet. The network 130 may include wired and/or wireless communications according to one or more standards and/or via one or more transport mediums.

The communication over the network 130 may be performed in accordance with various communication protocols such as Transmission Control Protocol and Internet Protocol (TCP/IP), User Datagram Protocol (UDP), and IEEE communication protocols. In one example, the network 130 may include wireless communications according to Bluetooth specification sets or another standard or proprietary wireless communication protocol. In another example, the network 130 may also include communications over a cellular network, including, for example, a GSM (Global System for Mobile Communications), CDMA (Code Division Multiple Access), or an EDGE (Enhanced Data for Global Evolution) network.

The system 100 is not confined to the components described herein and may include additional or other components, not shown for brevity, which are to be considered within the scope of the embodiments described herein.

The analytics server 110a may generate and display an electronic platform configured to train and/or use various computer models (including artificial intelligence and/or machine learning models) to use time series images of a diamond during synthesis to predict how the diamond will grow during a time period at pre-determined time-steps and predict whether the predicted diamond will have any defects and/or a shape or size of the predicted diamond. The electronic platform may include graphical user interfaces (GUI) displayed on each electronic data source 120, the end-user devices 140, and/or the administrator computing device 150. An example of the electronic platform generated and hosted by the analytics server 110a may be a web-based application or a web site configured to be displayed on different electronic devices, such as mobile and wearable devices, tablets, personal computers, and the like. In a non-limiting example, a technician operating the technician device 120b may train a machine learning model to predict data objects indicating predicted states of diamonds based on a sequence of time series images of a diamond captured during synthesis. To do so, the user may generate a training data set by creating a labeled data set of sequences of images of a diamond during synthesis within a diamond synthesis machine with labels indicating the ground truth data objects or images of the diamond's state at a pre-determined timestep in the future. The technician device may transmit the labeled dataset to the analytics server 110a and/or store the labeled dataset locally. The technician device 120b or the analytics server 110a may then feed the labeled dataset into one or more machine learning models configured to predict states of diamonds during synthesis for training. Upon being sufficiently trained, the analytics server 110a may use the trained machine learning model to predict states of diamonds during synthesis as data objects or images and feed the data objects or images into another machine learning model to predict whether the predicted data object or image will have any defects and/or a desirable size and/or shape after being synthesized for a predetermined time period.

As described herein, diamond synthesis parameters (or operating parameters) may be or include any parameters related to synthesizing or growing a diamond in a diamond synthesis machine. Diamond synthesis parameters may include, but are not limited to, temperature, pressure, input gases, input power, etc. In some embodiments, the diamond synthesis parameters may be different depending on the type of the diamond synthesis machine. For example, a diamond machine that is configured to only use heat and pressure to synthesize a diamond may not use input gases as a parameter. Diamond synthesis parameters may be or include any parameters.

The analytics server 110a may host a website accessible to users operating any of the electronic devices described herein (e.g., end-users), where the content presented via the various webpages may be controlled based upon the roles and/or viewing permissions of each particular user. The analytics server 110a may be any computing device comprising a processor and non-transitory machine-readable storage capable of executing the various tasks and processes described herein. Non-limiting examples of such computing devices may include workstation computers, laptop computers, server computers, and the like. While the system 100 includes a single analytics server 110a, the analytics server 110a may include any number of computing devices operating in a distributed computing environment, such as a cloud environment.

The analytics server 110a may execute software applications configured to display the electronic platform (e.g., host a website), which may generate and serve various webpages to each electronic data source 120 and/or end-user devices 140. Different users may use the website to view and/or interact with predicted results from the machine learning models.

The analytics server 110a may be configured to require user authentication based upon a set of user authorization credentials (e.g., username, password, biometrics, cryptographic certificate, and the like). The analytics server 110a may access the system database 110b configured to store user credentials, which the analytics server 110a may be configured to reference in order to determine whether a set of entered credentials (purportedly authenticating the user) match an appropriate set of credentials that identify and authenticate the user.

The analytics server 110a may also store data associated with each user operating one or more electronic data sources 120 and/or end-user devices 140. The analytics server 110a may use the data to weigh interactions while training various artificial intelligence (AI) models accordingly. For instance, the analytics server 110a may indicate that a user is a domain expert whose inputs may be monitored and used to train the machine learning or other computer models described herein.

The analytics server 110a may generate and host webpages (e.g., web pages for dashboards) based upon a particular user's role within the system 100. In such implementations, the user's role may be defined by data fields and input fields in user records stored in the system database 110b. The analytics server 110a may authenticate the user and may identify the user's role by executing an access directory protocol (e.g. LDAP). The analytics server 110a may generate webpage content that is customized according to the user's role defined by the user record in the system database 110b.

The analytics server 110a may receive diamond synthesis data (e.g., pictures in a time series of diamond synthesis image data) from a user or retrieve such data from a data repository, analyze the data, and display the results on the electronic platform. For instance, in a non-limiting example, the analytics server 110a may query and retrieve diamond synthesis images from the database 120d. The analytics server 110a may use various models (stored within the system database 110b) to analyze the retrieved data. The analytics server 110a may then display the results via the electronic platform on the electronic technician device 120b, the end-user devices 140, and/or the administrator computing device 150, The electronic data sources 120 may represent various electronic data sources that contain, retrieve, and/or input data associated with diamond synthesis parameters, captured images of diamonds during synthesis, and/or predicted images of diamonds during synthesis. For instance, the analytics server 110a may use the laboratory computer 120a, the technician device 120b, server 120c (associated with a technician and/or laboratory), and the database 120d (associated with the technician and/or the laboratory) to retrieve/receive diamond synthesis parameters to transmit to a diamond synthesis machine 160 to adjust how the diamond synthesis machine 160 operates to synthesize a diamond.

End-user devices 140 may be any computing device comprising a processor and a non-transitory machine-readable storage medium capable of performing the various tasks and processes described herein. For example, the models and image processing steps described herein may be stored and performed by end-user devices 140. Non-limiting examples of an end-user device 140 may be a workstation computer, laptop computer, tablet computer, and server computer. In operation, various users may use end-user devices 140 to access the GUI operationally managed by the analytics server 110a. Specifically, the end-user devices 140 may include a laboratory computer 140a, a laboratory server 140b, and or a laboratory device 140c, including a mobile or wearable device, such as a mobile phone, tablet computer, or digital glasses.

The administrator computing device 150 may represent a computing device operated by a system administrator. The administrator computing device 150 may be configured to display data retrieved or generated by the analytics server 110a (e.g., various analytic metrics, identifications of defects, and/or predicted images of diamonds) where the system administrator can monitor various models utilized by the analytics server 110a, electronic data sources 120, and/or end-user devices 140; review feedback; and/or facilitate the training of the machine learning models that are maintained by the analytics server 110a.

The diamond synthesis machine 160 may include a press (e.g., a belt press, a cubic press, or a split-sphere (BARS) press), a chemical vapor deposition machine, a machine that uses explosion techniques, or a machine that uses ultrasound cavitation. In operation, a technician may place one or more diamonds (e.g., diamond seeds) in or on a diamond holder of a diamond synthesis machine (e.g., the diamond synthesis machine 160) and select options on a user interface of the diamond synthesis machine or another device to input parameters for synthesizing the diamond. The user may input one-time parameters that the machine may maintain throughout operation (e.g., set temperature and/or pressure values) or a schedule of parameters that indicate times in which the machine will operate under different settings. In some instances, the user may select an identifier of a pre-configured schedule from a list of one or more pre-configured schedules. The pre-configured schedule may contain parameters for the diamond synthesis machine to use to synthesize the diamond over time. After selecting the parameters or schedule of parameters, the user may select an option to initialize the diamond synthesis process with the selected parameters or schedule.

Upon initialization, the diamond synthesis machine may operate to synthesize the diamond based on the selected parameters. After a predetermined time, the diamond synthesis machine may begin capturing pictures of the diamond and sending the pictures to the analytics server 110a. Additionally or instead, the diamond synthesis machine may send operation parameters to the analytics server 110a indicating how the diamond synthesis machine will be operating at various times while synthesizing the diamond (e.g., the input or selected schedule of parameters). In turn, the analytics server 110a may use the images and the systems and methods described herein to predict an image (or another data object such as a value or vector) of the diamond at a time in the future to detect whether synthesizing the diamond based on the current parameters and/or operating schedule would cause the diamond to have a defect or will be an improper shape or size upon completing synthesis. Based on a detection of a defect or an improper shape or size of the diamond, the analytics server 110a may generate configuration data to control the diamond synthesis machine and transmit instructions to the machine to change how the diamond synthesis machine operates to synthesize the diamond, thus causing the diamond synthesis machine to avoid creating a diamond with a defect and/or to cause the diamond to have an optimal shape or size.

The diamond synthesis machine 160 may capture time series images of the diamond during synthesis with the new parameters and transmit the pictures to analytics server 110a to repeat the process. The diamond synthesis machine 160 may repeat the process until determining that the current schedule of parameters would result in a diamond without any defects and/or has an optimal shape or size or until the diamond is synthesized to predetermined size or for a predetermined time period.

Figure 2:
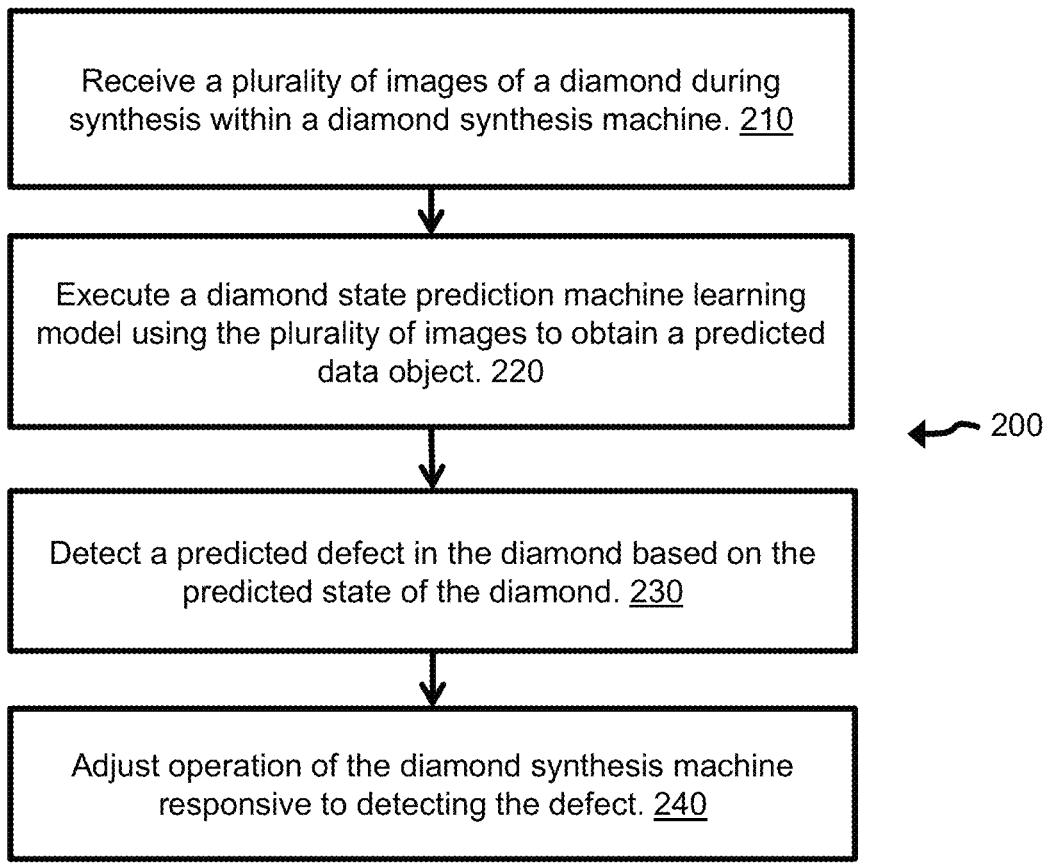
FIG. 2 illustrates a flow diagram of a process executed in a diamond synthesis system, according to an embodiment.

FIG. 2 illustrates a flow diagram of a method 200 executed in a diamond synthesis system, according to an embodiment. The method 200 may include steps 210-240. However, other embodiments may include additional or alternative steps, or may omit one or more steps altogether. The method 200 is described as being executed by a data processing system (e.g., a computer similar to the analytics server 110a, the data source 120, or the end-user device 140 described in FIG. 1). However, one or more steps of method 200 may be executed by any number of computing devices operating in the distributed computing system described in FIG. 1. For instance, one or more computing devices may locally perform part or all of the steps described in FIG. 2 or a cloud device may perform such steps.

At step 210, a data processing system may receive a plurality of images of a diamond during synthesis within a diamond synthesis machine. The images may be two-dimensional or a three-dimensional image and may include pixels or voxels, accordingly. As described herein, each reference to a pixel may be a reference to a voxel in cases in which the relevant image is a three-dimensional image. Each image may depict a diamond sitting on a diamond holder (e.g., a metal container configured to hold diamonds in place within the diamond synthesis machine during synthesis) as the diamond is being synthesized, or grown, within the diamond synthesis machine. The diamond synthesis machine may be configured to synthesize the diamond into a desired or predetermined size and/or for a predetermined time period. The images may have been taken or captured at predetermined time intervals by an image capture device (e.g., a camera, a phone, a recorder, etc.). The image capture device may be configured to capture the images at a pre-determined time interval and continuously send the captured images to the data processing system for processing. The image capture device may label each image with a timestamp to indicate when the device captured the image, when the device transmitted the image to the data processing system, and/or when the data processing system received the image. The data processing system may receive each image, identify the timestamps of a predetermined number of images or images associated with timestamps within a predetermined time period, and organize the images into a sequence to input into a machine learning model for further processing.

At step 220, a data processing system may execute a diamond state prediction machine learning model using the plurality of images to obtain a data object indicating a predicted state of the diamond at a time-step in the future. The data object may be a predicted image of the diamond, a value, a multi-dimensional value, a text description, or any other representation of the diamond. The machine learning model may be any machine learning model (e.g., a neural network based model, a random forest, a support vector machine, etc.) that is configured to generate a data object indicating a predicted state of the diamond within the diamond synthesis machine at a time in the future. The data processing system may execute the diamond state prediction machine learning model by retrieving the plurality of images (e.g., the image sequence of the diamond during synthesis) from storage or memory and generating a feature vector representing the pixels of the image. The data processing system may apply the feature vector to the diamond state prediction machine learning model to obtain a data object that indicates a predicted state of the diamond at a predetermined time-step into the future. For example, diamond state prediction machine learning model may generate an image depicting the diamond in a future state indicating how the diamond has grown, and any crystallization that formed within the diamond synthesis machine during synthesis.

To generate the feature vector based on the plurality of images, the data processing system may generate a feature vector with values that represent each pixel of the plurality of images. The values may be values that represent the color, brightness, and any other visual aspects of the plurality of images. In some cases, the data processing system may normalize the input values to values between −1 and 1 or 0 and 1 to obtain more accurate results as the diamond state prediction machine learning model processes the feature vector.

The diamond state prediction machine learning model may be a deep learning model based on units for convolutional long short-term memory that is configured to predict states (e.g., size, shape, and/or any defects) of the diamond within the diamond synthesis machine for multiple time-steps into the future. The diamond state prediction machine learning model may be configured to generate the predicted data object for the diamond by sequentially predicting the diamond's state for different time-steps into the future, in some cases using the predicted data object or predicted data objects of the diamond from previous time-steps to generate the predicted object for the following time-step. For example, the diamond state prediction machine learning model may use the plurality of images as input to predict a first state of the diamond two hours into the future in a predicted data object (e.g., a multidimensional vector with values representing the pixels of a predicted image or a predicted image itself). The diamond state prediction machine learning model may use the predicted data object of the diamond in the first state as an input into the diamond state prediction machine learning model to predict a second state of the diamond four hours into the future in another predicted data object such as a multidimensional vector or image. The diamond state prediction machine learning model may continue to predict states of the diamond until the model reaches the last time-step for which the diamond state prediction machine learning model is configured to make a prediction. The diamond state prediction machine learning may be configured to use any number of time-steps with time-steps of any length to predict a final state of the diamond. Using a network architecture comprising units for long short-term memory networks may enable the machine learning model to accurately predict the shape and size of a diamond further into the future given that the growth of the diamond is dependent on its immediately previous state and slight variations at the beginning of the growth cycle may cause the diamond to have a wide range of potential growing patterns into the future.

In some cases, in addition to using the plurality of images as an input into the diamond state prediction machine learning model, the data processing may also use a schedule of operating parameters as an input. A schedule of operating parameters may be a timed schedule of parameters the diamond synthesis machine may use to synthesize the diamond. The schedule may be input by a user or an administrator and may include scheduled values that correspond to the times in which each of the images were captured and/or times between the times the images were captured and the time of predicted data object (which may help account for changes in operation of the diamond synthesis machine that may affect the diamond's growth). For example, the diamond synthesis machine may be scheduled to apply a relatively high pressure to the diamond two days into the synthesis process and increase or decrease the pressure at predetermined rates or to predetermined values until the diamond synthesis machine finishes synthesizing the diamond. The diamond synthesis machine may follow similar schedules for any other operating parameters. The data processing system may retrieve the operating parameters that the diamond synthesis machine is using to synthesize the diamond pictured in the plurality of images and include the parameters, in some cases with their corresponding timestamps, in the feature vector that the data processing system uses to execute the diamond state prediction machine learning model. By accounting for the operating parameters of the diamond synthesis machine during synthesis, the diamond state prediction machine learning model may be able to provide a more accurate prediction of the final state of the diamond. Furthermore, in some cases, a training data set that is used to train the diamond state prediction machine learning model may be curated to include a high amount of variance (potentially within limits of safe operation) between operating parameters and diamond characteristics so the diamond state prediction machine learning model may learn a generalized function for diamond growth.

To generate or train the diamond state prediction machine learning model, the data processing system may use one or more labeled training data sets for supervised training. For example, the data processing system may create or use a training data set comprising a chronological series of images corresponding to a set of images of previously synthesized diamonds (e.g., images corresponding to growth runs captured for previously synthesized diamonds). The chronological series of images may be captured images of a diamond during synthesis. In cases in which the diamond state prediction machine learning model predicts an image of the diamond at a future point in time. The data processing system may create a training data set from the series of images and then obtain a labeled image of the diamond from the image capture device that was captured at a predetermined time after the series of images was captured. The predetermined time may be the time for which the diamond state prediction machine learning model is being trained to predict images of diamonds being synthesized. The data processing system may feed the series of images into the diamond state prediction machine learning model and obtain an output predicted image depicted the diamond in a predicted state. The data processing system may compare the output predicted image with the labeled image to a determine difference between the two images and train the diamond state prediction machine learning model by adjusting the machine learning model's internal weights and parameters proportional to the determined difference according to a loss function.

In cases in which the diamond state prediction machine learning model is configured to predicted other data objects (e.g., values or feature vectors) indicating a predicted state of a diamond during synthesis, the diamond state prediction machine learning may also be trained using one or more labeled training data sets for supervised training. For example, the data processing system may use a curated training data set comprising a chronological series of images corresponding to a set of images of previously synthesized diamonds. Each chronological series of images may be labeled with a ground truth value or feature vector indicating a ground truth state of the diamond during synthesis at a pre-determined time in the future. The data processing system may feed the series of images into the diamond state prediction machine learning model and obtain an output predicted data object indicating a predicted state of the diamond. The data processing system may compare the output predicted data object with the ground truth data object to a determine difference between the data objects and train the diamond state prediction machine learning model by adjusting the machine learning model's internal weights and parameters proportional to the determined difference according to a loss function.

The data processing system may train the diamond state prediction machine learning model in a similar manner until determining the diamond state prediction machine learning model is accurate to a threshold. Upon determining the diamond state prediction machine learning model is accurate to the threshold, the data processing system may implement the machine learning model for real-time data object predictions of diamonds being synthesized in a diamond synthesis machine. After implementing the data processing system for real-time data object predictions, the data processing systems may continue to train the machine learning model using data that is generated during synthesis to account for any changes in operation of the diamond synthesis machine that may occur over time.

At step 230, a data processing system may detect a predicted defect in the diamond based on the predicted data object. The predicted defect may be an occlusion, a chip, a color defect, macroscopic defect contours, microscopic defect contours, center defects, edge defect, or any other crystallographic defect. As described herein, a defect may also include an undesired shape or size or an undesired amount of polycrystalline diamond growth. The data processing system may detect the defect using post-processing techniques on the predicted data object of the diamond. In some instances, in cases in which the data object is an image, the data processing system detects the defect by evaluating the diamond depicted in the predicted image according to a set of diamond defect rules. For example, the data processing system may identify a shape and or size of the diamond based on a contour of the diamond outlined in a predicted image and compare the shape or size to a set of diamond defect rules. The data processing system may determine the shape or size satisfies a rule and, responsive to determining the shape or size satisfies the rule, determine the diamond has a defect (e.g., the diamond is too small, too large, or has an undesired shape). In another example, the data processing system may determine the size of the diamond based on a contour of the diamond outlined in a predicted image and compare the size to a rule (e.g., to a threshold). If the size satisfies the rule, the data processing system may determine the diamond has a defect. In yet another example, the data processing system may identify crystallization (e.g., polycrystalline) in the predicted image that is not a part of the predicted diamond or a part of the diamond holder. The data processing system may identify the crystallization based on the crystals being separate from the diamond and, in some cases, determine the diamond in the predicted image has a defect based on the predicted crystallization. In yet another example, the data processing system may compare defect contours that the data processing system identifies in the image, compare the defect contours to one or more rules, and determine the diamond has one or more of a macroscopic defect contour, a microscopic defect, a center defect, and/or an edge defect based on the contours satisfying one or more rules. In yet another example, in cases in which the predicted data object is a value or a vector, the data processing system may compare the value or vector to a rule. If the value or vector satisfies a rule, the data processing system may determine there is a defect in the diamond. The data processing system may determine the diamond has a defect based on any rule.

In some instances, the data processing system may use a feature extraction machine learning model to determine whether the diamond indicated in the predicted data object has any defects and/or types of such defects (e.g., an occlusion, a chip, a color defect, macroscopic defect contours, a microscopic defect, a center defect, an edge defect, or any other crystallographic defect). In cases in which the predicted data object is an image, the feature extraction machine learning model may be configured to make a multi-class prediction in which the feature extraction machine learning model indicates if individual pixels depict a defect and/or a type of such defect in the diamond. In such cases, the data processing system may generate a feature vector from the output of the diamond state prediction machine learning model (e.g., the predicted image depicting the predicted state of the diamond) and apply the feature vector to the feature extraction machine learning model. Upon processing the feature vector, the feature extraction machine learning model may output labels for pixels or portions of the image that indicate whether the pixels indicate any defects and/or types of such defects. The data processing system may evaluate the output labels for individual pixels and determine if there are any defects in the predicted state of the diamond by determining if there are any pixels (and/or contours) that were labeled with a defect and/or a defect type label.

In cases in which the predicted data object is a value or a vector, the feature extraction machine learning model may be configured to make a multi-class prediction in which the feature extraction machine learning model indicates if the value or vector indicate that the diamond has a defect in the predicted states that corresponds to the value or vector. In such cases, the data processing system may generate a feature vector from the value or vector and apply the feature vector to the feature extraction machine learning model. Upon processing the feature vector, the feature extraction machine learning model may output an indication of any defects and/or defect types in the predicted state of the diamond that correspond to the value or vector.

In some instances, the data processing system may determine predicted characteristics of the predicted state of the diamond using the feature extraction machine learning model. For example, in cases in which the data object is a predicted image, instead of or in addition to predicting defects and/or defect types of diamonds in a predicted state, the feature extraction machine learning model may also predict labels that identify sections of the diamond in the predicted state (e.g., diamond top, diamond side one, diamond side two, pocket holder, etc.). The data processing system may identify the labels of the different pixels of the image and determine the shape and/or contour of the diamond in the predicted state based on the labels. For example, the data processing system may increment counters for each of the pixel labels and determine the size and/or shape of the diamond based on the incremented counter. Each pixel may correspond to a set size and the data processing system may determine the number of pixels with the same label and multiply the number by the size of the pixels to determine the size of the part of the diamond and/or pocket holder. The data processing system may use the size of the diamond to determine if the diamond has any size-related defects or is otherwise growing to an undesired size or shape (e.g., by comparing the size and/or shape to stored rules).

Similarly, in instances in which the predicted data object is a value or a vector, the feature extraction machine learning model may be configured to predict a size and/or shape of the diamond in the predicted state based on the predicted value or vector. In such instances, the data processing system may generate a feature vector from the value or vector and apply the feature vector to the feature extraction machine learning model. Upon processing the feature vector, the feature extraction machine learning model may output an indication of the size and/or shape of the diamond in the diamond's predicted state and determine whether the size and/or shape is an undesired size or shape based on the output indication.

The feature extraction machine learning model may use a "fully convolutional" segmentation architecture currently including an encoder and decoder combination to classify the images it receives. The encoder may work towards down-sampling from a 5,000×2,400 image to a vector of learned features and the decoder may reconstruct segmentation masks for the diamond and pocket-holder using a combination of up-sampling techniques. The encoder architecture may comprise a 34-layer residual network with a convolution filter of 7×7×64, followed by four 3×3×64 convolutional layers, then eight 3×3×128 convolutional layers with four 3×3×256 layers at the end. The architecture may be interspersed with pooling and batch normalization layers to add regularization capabilities as relevant. The feature extraction machine learning model may use a Softmax activation at the output layer to calculate the log-likelihood and generate a 256-dimensional probabilistic feature vector. The decoder may then up-sample by fusing feature maps from 3 previous pooling layers to reconstruct segmentation masks of target objects. The feature extraction machine learning model may use an 8×-upsampling technique to work for high accuracy measurements on the data distribution. The non-linear learning capabilities of neural networks/deep learning help capture and generalize complex distribution patterns in target images, which can result in over 99% accuracy predictions for the feature extraction machine learning model.

At step 240, a data processing system may adjust operation of the diamond synthesis machine responsive to detecting the defect or that the diamond will grow to an undesired shape or size. The data processing system may adjust operation of the diamond synthesis machine by transmitting instructions comprising one or more operating parameters (e.g., pressure or temperature) and/or parameter schedules, to the diamond synthesis machine that causes the diamond synthesis machine to operate based on the transmitted parameter or parameters. The data processing system may select or retrieve the parameter or parameters from memory responsive to detecting the defect or that the diamond will grow to an undesired shape or size and transmit the selected parameter to the diamond synthesis machine.

In some cases, the data processing system may select the parameter or parameters based on the detected defect, type of the defect, and/or the undesirable shape or size. For example, the data processing system may identify a type defect as described above and use the defect type as a look-up in memory to determine which parameters correspond to the detected defect type. The data processing system may identify the matching parameter or parameters that correspond to the defect type and retrieve the identified parameter to use to adjust operation of the diamond synthesis machine. The data processing system may similarly select parameters using an undesirable shape or size as a look-up to identify parameters.

The data processing system may additionally or instead generate a record indicating a defect and/or undesirable shape or size was detected in the predicted image or data object, the type of the defect, and/or the parameter or parameters that the data processing system retrieved to resolve or avoid the defect and/or undesirable shape or size. The data processing system may transmit the record to a processor such as an end-user device for display on a user interface. A user may display the information and attempt to stop the defect or undesirable shape or size from occurring or otherwise analyze the defect or shape or size to try to avoid similar problems in the future.

In some cases, the data processing system may perform the above-described steps and determine there is not a defect in the diamond in the predicted image or data object and/or that the diamond will have a desired shape and/or size. In such cases, the data processing system may generate a record (e.g., a file, document, table, listing, message, notification, etc.) indicating that a defect could not be found and/or that the diamond is predicted to have a desired shape and/or size and transmit the record to a computing device and/or to the diamond synthesis machine. The record may be displayed at the receiving device and indicate not to adjust the parameters of the diamond synthesis machine. If the data processing system determines the current operating parameter schedule would enable the diamond synthesis machine to synthesize the diamond without any defects and/or to have a desired shape or size, the data processing system may stop evaluating images sent by the image capture device to the data processing system or transmit a signal to the image capture device to stop the image capture device from capturing or sending such pictures. By doing so, the data processing system may save energy resources that are required to capture, send, receive, and/or store such images. In an alternative embodiment, the data processing system may not send the image capture device any signals and may instead continue to iteratively repeat the above-described process to account for any unexpected growth patterns in the diamond that may occur during synthesis.

The data processing system may save the data that the machine learning models generate and any analysis data that the data processing system generates when the data processing system analyzes the data to detect defects and/or undesirable shapes or sizes in storage or in memory. The data processing system may save such data over time so the data may be compared with each other between iterations of diamond synthesis. In some cases, the stored data may be used to support claims of quality, provenance, etc., if a third party asks for assurances that a produced diamond is of high quality and seeks to know how the diamond was made. The data processing system may requests for the stored data, generate a record based on the request, and transmit the record to the requesting entity.

The data processing system may expand the process described herein to increase the parasitic polycrystalline diamond growth during diamond synthesis. Such growth may enable the diamond synthesis machine to boost growth of diamond material from diamond seeds. For example, in addition to training the diamond state prediction machine learning model and the feature extraction machine learning model to accurately predict diamond growth states as well as any defects in predicted diamonds and/or undesired sizes and/or shapes for diamonds during synthesis, a data processing system may also train the machine learning models to predict polycrystalline diamond growth and make adjustments to optimize the amount of polycrystalline diamond growth that may occur for a diamond seed during synthesis. The machine learning models may be trained to predict when a synthesized diamond will not produce enough polycrystalline similar to how the models may be trained to predict when a synthesized diamond will have a defect or will have an undesired shape or size as described above and the data processing system may use sub-optimal predictions of polycrystalline diamond growth to adjust the parameters of the diamond synthesis machine in a guided system. Thus, the systems and methods described herein may provide for an increase in the yield of diamond seed during synthesis.

In some cases, an operator may use the systems and methods described herein to make sure the diamond seed that the operator places in the machine can grow to a desired size and shape. For example, an operator may wish to grow a diamond with dimensions 1.5A×15.B. The operator may place a diamond seed in the diamond synthesis machine and begin synthesizing the diamond.

Figure 3:
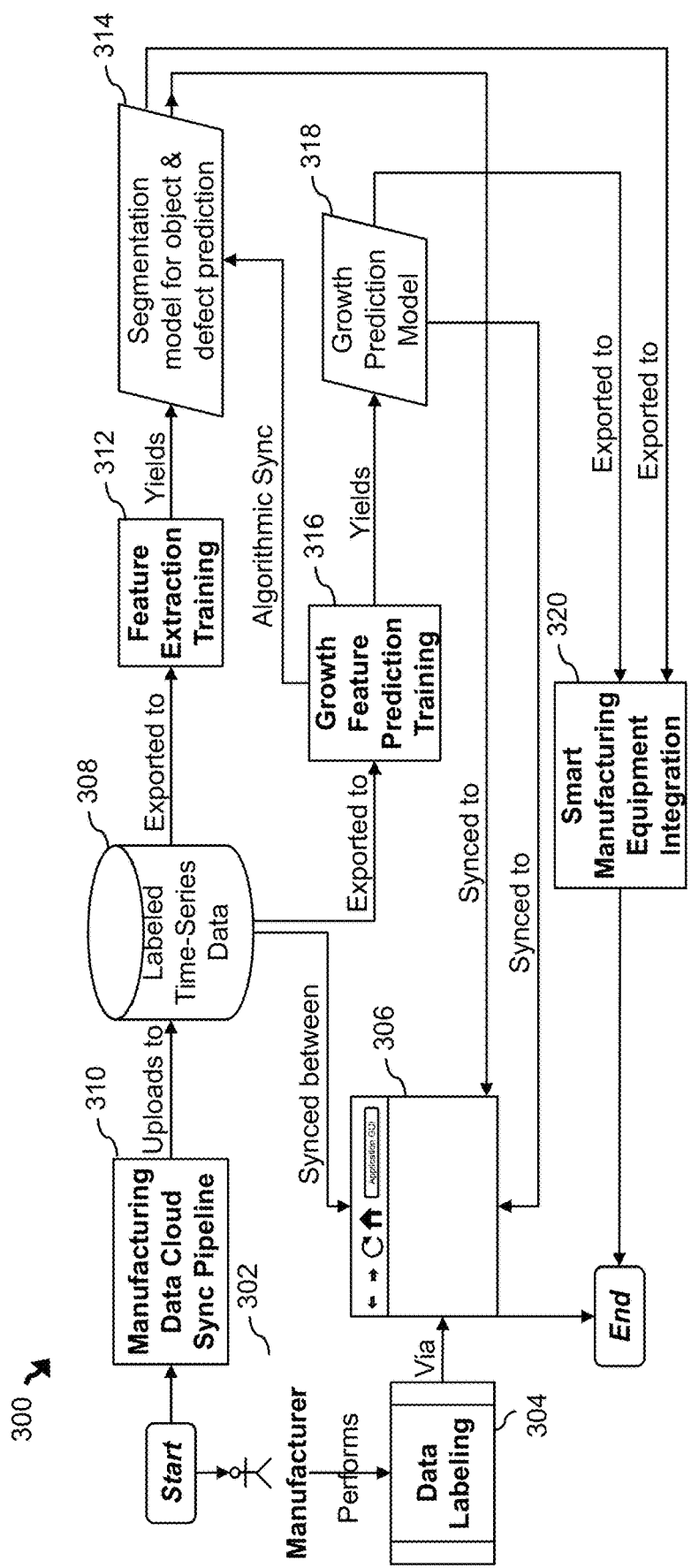
FIG. 3 illustrates a flow diagram of a process for training machine learning models to generate predicted growth images of diamonds during synthesis, according to an embodiment.

Referring now to FIG. 3, a flow diagram of a method 300 for training machine learning models to generate predicted growth images of diamonds during synthesis is illustrated. The method 300 may include steps 304, 310, 312, 316, and/or 320. However, other embodiments may include additional or alternative steps, or may omit one or more steps altogether. The method 300 is described as being performed by a user 302 and/or a data processing system (e.g., a computer similar to the analytics server 110*a*, the data source 120, or the end-user device 140 described in FIG. 1). However, one or more steps of method 300 may be executed by any number of computing devices operating in the distributed computing system described in FIG. 1. For instance, one or more computing devices may locally perform part or all of the steps described with respect to FIG. 3 or a cloud device may perform such steps.

The user 302 may be a human operator such as a domain expert in process cycle development. Operators may identify and label features in images to train machine learning models based on the generated labeled training data. Operators may use a graphical user interface 306 to label time series data for prescription, which may include the data processing system using growth prediction models to predict growth states at a future point in time and subsequently using segmentation models to analyze the output predicted growth states. These models may then be integrated to manufacturing equipment for smart decision-making (e.g., a closed-loop control system).

For instance, at step 304, the user 302 may access the graphical user interface 306 to label images with labels indicating whether the pixels of the images depict a diamond, a diamond holder, a background, and/or, in some cases, a defect and/or defect type in a diamond. The user may do so by drawing contours on the images that label the pixels. The user interface may be synchronized with a labeled time-series database 308 that stores labeled image data that can be used for training. By labeling the image data, the user 302 may enable the data processing system to use a supervised training method to train machine learning models to segment images for feature extraction and for diamond growth prediction.

At step 310, data from a manufacturing data cloud sync pipeline may be uploaded to the labeled time-series database 308. The data may include ex-situ data from data providers that includes information about diamonds and any defects in the diamonds. Such information may include the operating parameters that were used to create or grow the diamonds and any defects that formed in the diamonds as a result of the growth. The information may also include labeled training images, in some instances. The data processing system may receive and store this data in the labeled time-series database 308. The data can be used for training machine learning models for feature extraction and to make diamond growth predictions, as well as to determine whether diamonds have any defects in predicted images or data objects. In some instances, the data can be used to train a machine learning model to predict sizes and/or shapes of diamonds in a predicted state.

At step 312, the data processing system may train a segmentation model 314 to extract features from images of diamonds on diamond holders (e.g., diamonds within a diamond synthesis machine). The data processing system may additionally and/or instead train the segmentation model 314 or another model to detect defects or undesirable shapes and/or sizes in the diamond in images (e.g., predicted images) using the labeled training data from the labeled time-series database 308. The data processing system may similarly train the segmentation model 314 to predict defects and/or undesirable shapes and/or sizes based on other data objects that represent a predicted state of a diamond during synthesis. Similarly, at step 316, the data processing system may train a growth prediction model 318 to generate a predicted image of a diamond (or another data object indicating a predicted state of the diamond) at a predetermined time in the future based on a series of images of the diamond during synthesis and/or operating parameters of the diamond synthesis machine performing the synthesis. Outputs of the segmentation model 314 and the growth prediction model 318 may be synchronized with the user interface 306 so the user 302 can view the training progress of the models 314 and 318. Upon being sufficiently trained and at step 320, the data processing system may export the trained machine learning models to different devices (e.g., diamond synthesis machines, analytics servers, end-user devices, etc.) to aid in a guided diamond synthesis process as described herein.

Figure 4:
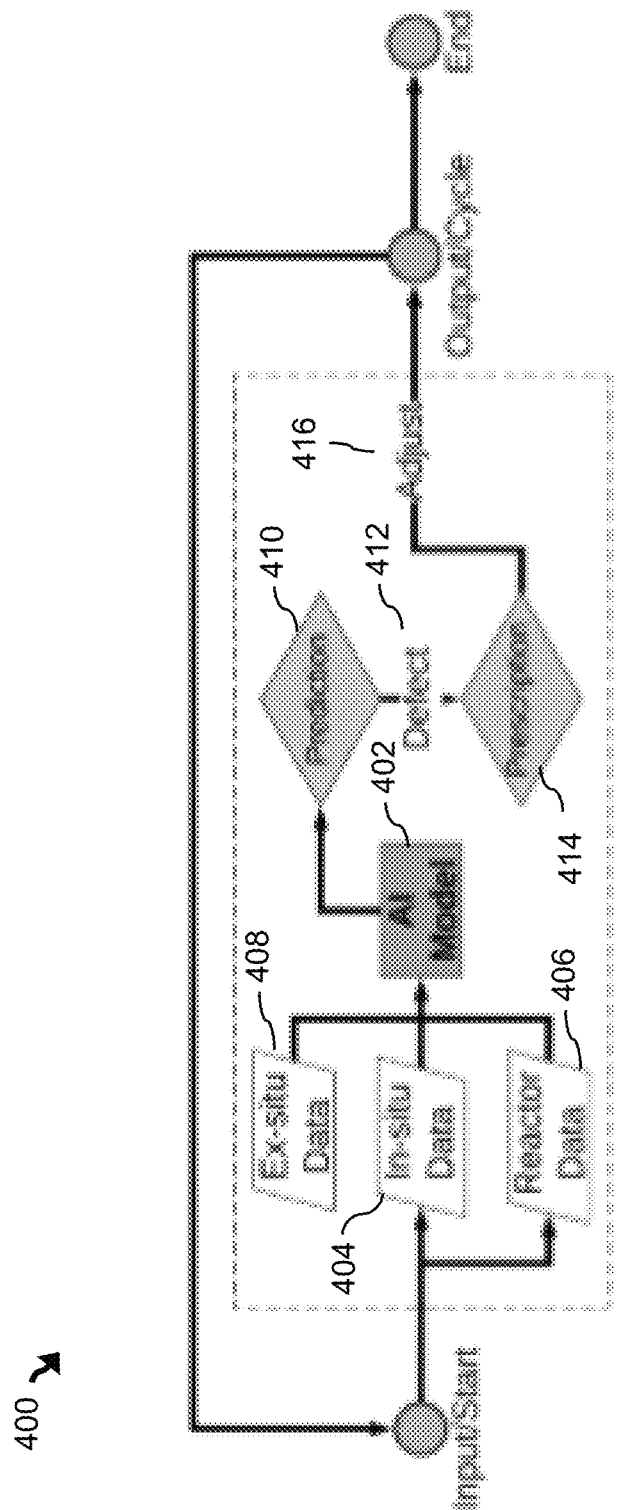
FIG. 4 illustrates a flow diagram of a process for synthesizing a diamond using a guided approach, according to an embodiment.

Referring now to FIG. 4, a flow diagram of a method 400 for synthesizing a diamond using a guided approach is illustrated. In the method 400, a data processing system (e.g., a computer similar to the analytics server 110*a*, the data source 120, or the end-user device 140 described in FIG. 1) may execute a diamond state prediction machine learning model 402 using a sequence of images of the diamond to generate a predicted image of the diamond (or another data object indicating a predicted state of the diamond) during synthesis by a diamond synthesis machine. The data processing system may detect a defect and/or an undesirable size or shape in the diamond and adjust the configuration of the diamond synthesis machine in a closed-loop control system to optimize the output diamond from the diamond synthesis machine.

For example, a user may initialize the diamond synthesis process by placing a diamond seed in a diamond synthesis machine, selecting parameters for synthesis, and selecting an option to cause the diamond synthesis machine to synthesize the diamond. While the diamond synthesis machine synthesizes the diamond, an image capture device may capture images of the diamond at predetermined intervals. The image capture device may transmit the images to the data processing system as in-situ data 404 (e.g., on-site data). The data processing system may collect reactor data 406 (e.g., scheduled operating parameters of the diamond synthesis machine for synthesizing the diamond), and ex-situ data 408. The ex-situ data 408 may include defect data that was generated offsite and may also include rules or other data that can be used to detect a defect or undesirable shapes and/or sizes in predicted images or data objects indicating a predicted state of the diamond. The diamond state prediction machine learning model 402 may generate a predicted data object indicating a predicted state of the diamond at a future time at step 410. The data processing system may evaluate the data object and detect a defect in the diamond or that the diamond does not have a desired shape or size based on the predicted state of the diamond at step 412, and determine parameters to send to the diamond synthesis machine at step 414. The data processing system may adjust the diamond synthesis machine at step 416 and repeat the process of the method 400 until the diamond synthesis process has been completed, or the data processing system determines the diamond state prediction machine learning model 402 has output a predicted data object of the diamond without any defects and/or an indication that the diamond will be synthesized to have a desired shape or size (e.g., a predetermined shape or size, in some cases within a buffer range).

Figure 5:
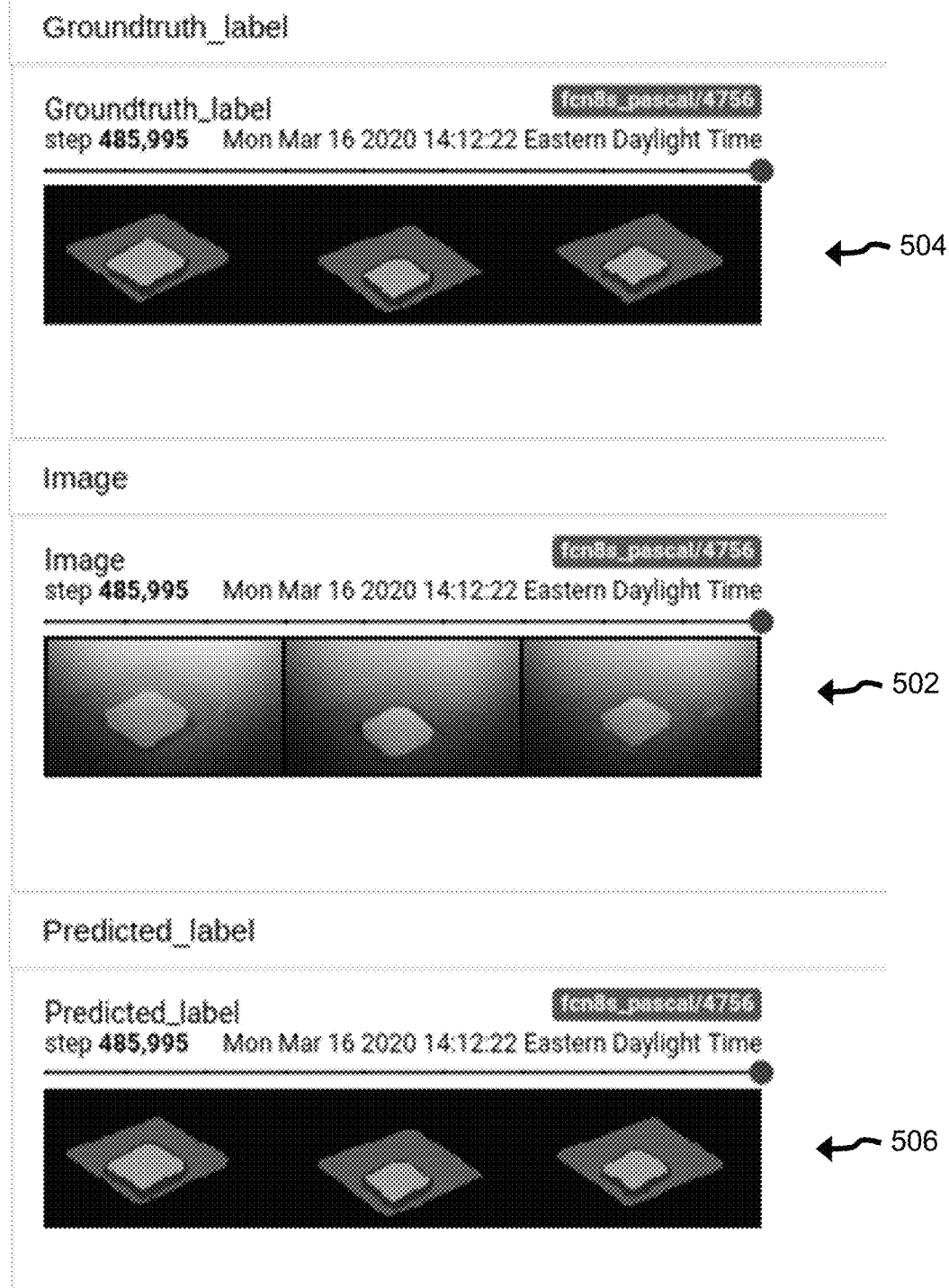
FIG. 5 illustrates images of predicted and expected labels for an image of a diamond during synthesis, according to an embodiment.

Referring now to FIG. 5, image sequences of predicted labels for images of a diamond during synthesis and expected labels for the images are illustrated. Via a user interface, human operators may label contour features on objects in the images of an image sequence 502 to specify the 'Ground truth' and create a ground truth image sequence 504. The image sequence 502 may be or include images of a diamond within a diamond synthesis machine captured in sequence such as at predetermined intervals. A user may view the images of image sequence 502 and use a contouring tool to specify or label pixels of the image sequence 502 with labels of classifications indicating whether the corresponding pixels depict a diamond, different parts of the diamond, a diamond holder, a background, a defect, a defect type, etc.

Through a data processing system (e.g., a computer similar to the analytics server 110a, the data source 120, or the end-user device 140 described in FIG. 1), the user may input the image sequence 502 into a machine learning model (e.g., a feature extraction machine learning model) to train the machine learning model to predict classifications for each pixel of the image sequence 502. The machine learning model may process the image sequence 502 and output a predicted image sequence 506 with labels for each pixel indicating predictions of whether the pixels represent a diamond, a diamond holder, a defect, a defect type, a background, etc. The data processing system may determine differences between the predicted image sequence 506 and the ground truth image sequence 504 and use back-propagation techniques with a loss function to train the machine learning model based on the differences. Thus, a user may facilitate training a machine learning model to predict or extract features from an image or a sequence of images of a diamond on a diamond holder within a diamond synthesis machine.

In some embodiments, the user may label the pixels with defect labels to indicate locations in which defects are located on diamonds and/or types of such defects. For example, a machine learning model may be trained to predict classifications for pixels including diamond clean, diamond holder, diamond defect, diamond defect type, and background using similar methods to above. The machine learning model may be trained to predict any classifications. Such training may enable a machine learning model to predict whether diamonds in a predicted image have any defects, the types of such defects, and the locations of such defects on the diamonds during post-processing.

Notably, the extracted features from the image sequence 502 may be numerical vector outputs generated by non-linear activation functions (e.g., logistic). The extracted features may have no visual significance and may be intended to help operators develop their optimization algorithms towards achieving better convergence on a loss function that is used to train the machine learning model.

Figure 6:
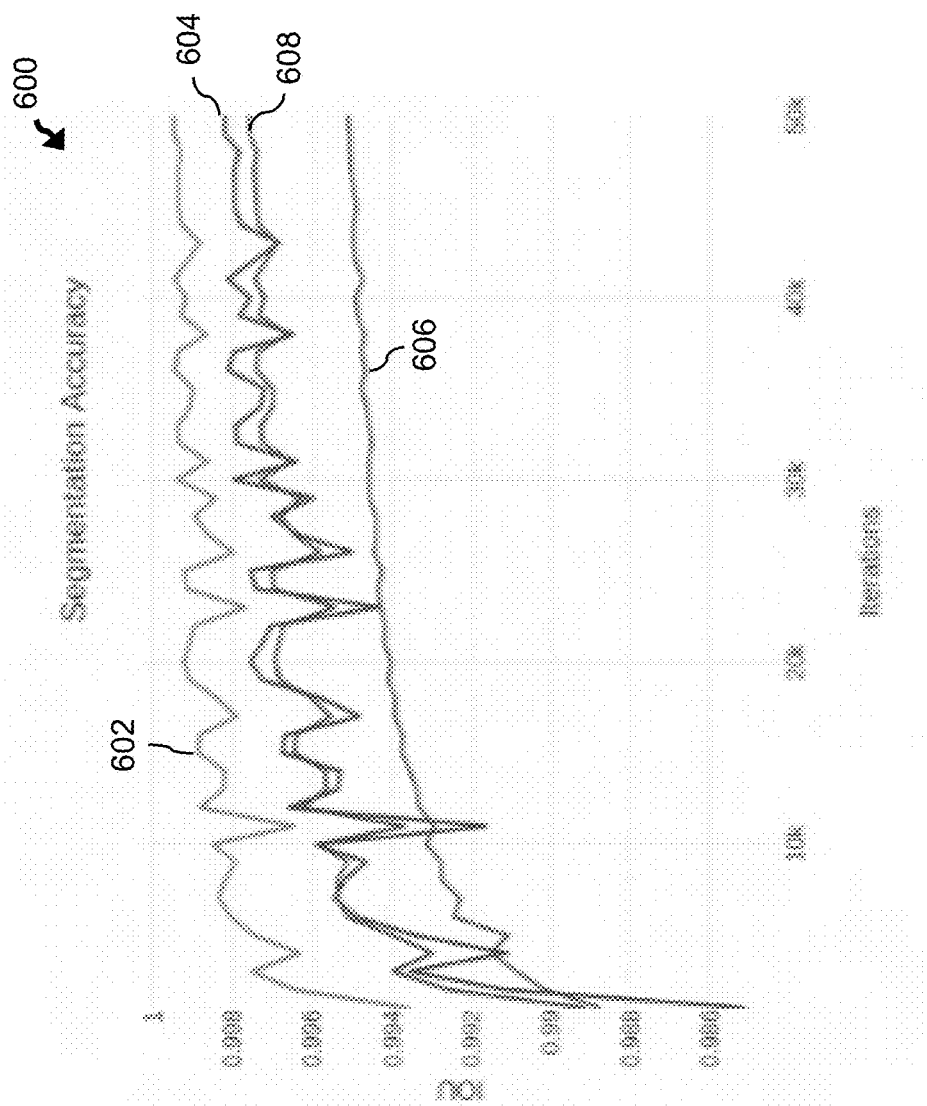
FIG. 6 illustrates a graph displaying the training progress of a model being trained to extract image features from an image, according to an embodiment.

Referring now to FIG. 6, a graph 600 displaying the training progress of a model trained to extract image features from an image is illustrated. The graph 600 includes accuracy data of a machine learning model being trained to classify pixels of images into a background class 602, a pocket holder class 604, and a diamond class 606 over a number (e.g., 50,000) of iterations of images or sequences of images. As illustrated, as the machine learning model receives and is trained based on further images, the machine learning model becomes more accurate. After training for the number of iterations, the machine learning model is shown to have a final mean pixel identification accuracy of 99.8% for the background class 602, 99.44% for the pocket holder class 604, and 99.66% for the diamond class 606. A line 608 illustrates the total accuracy of the machine learning model over training instances and shows a final mean pixel identification accuracy of 99.7%.

Figure 7:
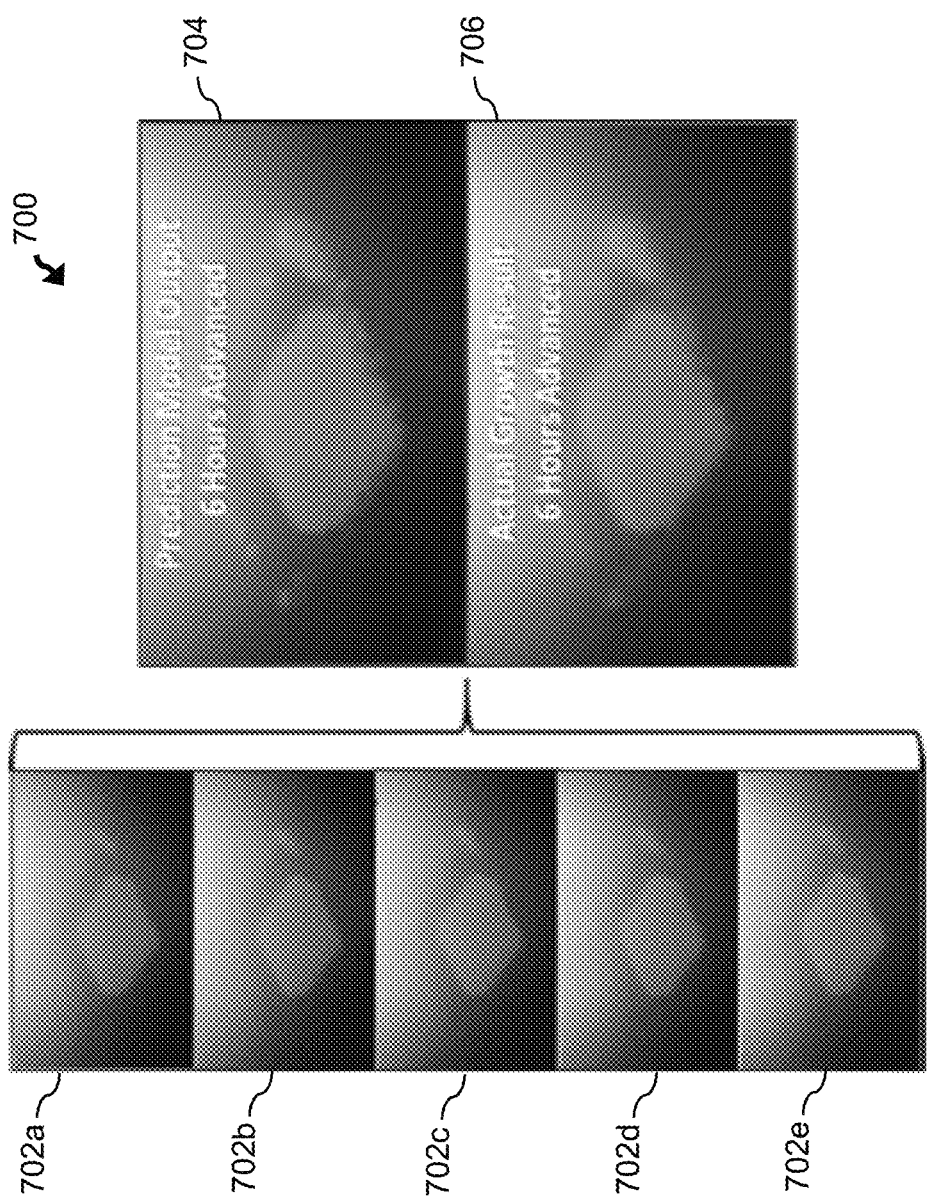
FIG. 7 illustrates a sequence of a machine learning model predicting a predicted image of a diamond based on time series images of the diamond during synthesis, according to an embodiment.

Referring now to FIG. 7, a sequence 700 of a machine learning model predicting a predicted image of a diamond based on time series images of a diamond during synthesis within a diamond synthesis machine is illustrated. A sequence of images 702a-702e may be input into a machine learning model (e.g., a network architecture comprising units for long short-term memory networks that is configured to make predictions for future states (e.g., future time-steps) of the diamond during synthesis and then make further predictions for states of the diamond based on the previous predictions). The sequence of images 702a-702e may include images that were captured by an image capture device (e.g., a high-definition camera) configured to capture images of diamonds within a diamond synthesis machine at pre-configured intervals (e.g., every two minutes). The sequence of images 702a-702e may be input into the machine learning model and the machine learning model may output a predicted image 704 of the diamond (and other diamond crystallization that may grow during synthesis) at a time (e.g., six hours) into the future.

An actual image 706 depicts the expected output of the machine learning model. As illustrated, the predicted image 704 is similar to the actual image 706 and thus, by implementing the systems and methods described herein, a data processing system may use the machine learning model to accurately predict how a diamond and other crystallization will grow during synthesis.

Figure 8:
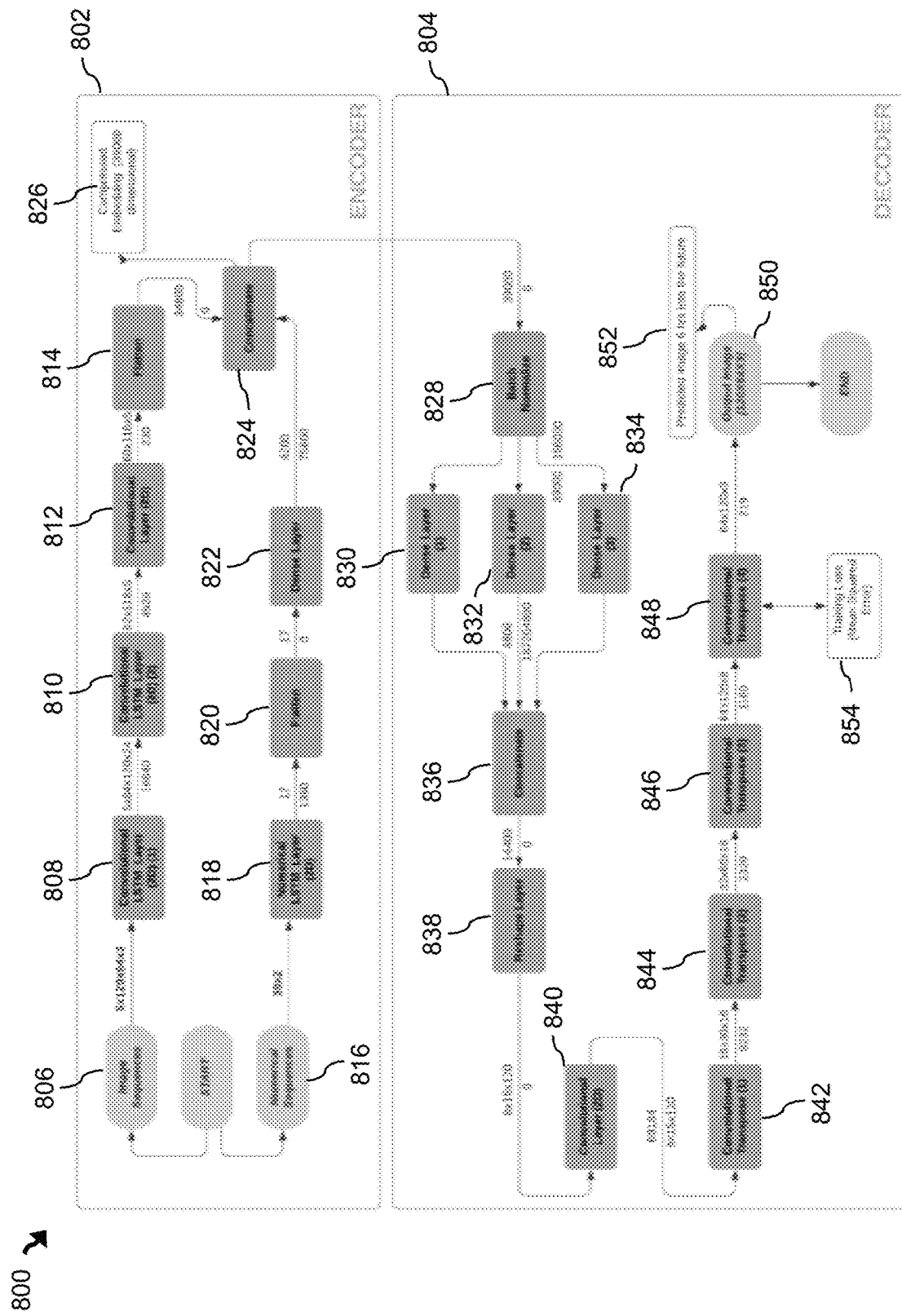
FIG. 8 illustrates an image prediction model, according to an embodiment.

Referring now to FIG. 8, an illustration of an image prediction model 800 is illustrated. The image prediction model 800 may be the same as or similar to the diamond state prediction model 160. The image prediction model 800 may include an encoder 802 and a decoder 804 and may be configured to generate a predicted image or another data object indicating a predicted state of a diamond during synthesis after a pre-determined number of time-steps. The encoder 802 may be configured to consolidate time series information from input image sequences and numerical sequences of reactor parameters into a fixed 14,400-dimensional vector. The decoder 804 may be configured to reconstruct an output RGB image corresponding to the predicted reactor state expected after pre-determined number of time-steps into the future. The image prediction model 800 may be used for predicting growth states six hours or any other amount of time into the future, in some cases with a validation accuracy of 99.99989%. For each arrow between the respective layers of the image prediction model 800, the text above the respective arrows may denote the shape/dimensionality of the output data emerging from the preceding layer and the text below may signify the total number of learnable parameters used within the preceding layer. The image prediction model 800 may include a total number of trainable parameters of 561 million. Thus, the image prediction model 800 may use diamond growth state predictions to solve a sequential time series problem with an exponentially increasing parameter space. This is because each new growth state of the diamond may contribute towards the next, potentially overriding but still depending on the previous growth state of the diamond.

Reactor (e.g., diamond synthesis machine) parameters may be logged on a per-second interval and may include input process gases, pressure, reactor temperature, input and reflected power, pocket depth and dimensions, lateral substrate dimensions, etc. An optical image recorder or an image capture device may capture images of a diamond being synthesized with a diamond synthesis machine at a constant time interval until the final stage of the growth runs. The image prediction model 800 may include a sequence-based growth prediction pipeline to predict states of diamonds during synthesis up to a predetermined time period in the future (e.g., 1 hour, 2 hours, 3 hours, 6 hours, 12 hours, 1 day, 1 week, or for any other predetermined time period). In one example, a system implementing the systems and methods described herein may achieve a best mean pixel-loss-based accuracy achieved for a 6-hour case of 99.99989%. The system may use the following user-defined parameters to make the predictions:

1) Input Data: Groups of x Image Sequences separated by y-minute intervals; (5+t−1) Numerical sequences of temperature, pressure tuples separated by y-minute intervals
2) Output Data: Single output image frame (or another data object) of the model's prediction for reactor state t time steps into the future where x and y are random variables determined after a number of training runs to determine their optimal values, and t is the number of time-steps into the future to predict a state of a diamond being synthesized.

Based on the input parameters, the model may be configured to receive values for approximately 561 million trainable parameters and may employ an encoder-decoder architecture on a broad level as illustrated in FIG. 8. The encoder 802 may be optimized to consolidate time series information from an input image sequence 806 via layers 808, 810, 812, and 814, and numerical sequences 816 (e.g., reactor parameters) via layers 818, 820, and 822. The encoder 802 may use a concatenate layer 824 to concatenate the consolidated images sequences 806 and numerical sequences 816 into a fixed multi-dimensional (e.g., 14,400- or 39,000-dimensional) vector 826. The decoder 804 may receive the multi-dimensional vector 826 and pass the multi-dimensional vector 826 through layers 828, 830, 832, 834, 836, 838, 840, 842, 844, 846, and 848 of the decoder 804 to an output layer 850. The data processing system may obtain a predicted image 852 (or another data object, such as a multi-dimensional vector, a value, etc.) at the output layer 850 that indicates the predicted state of the diamond being synthesized at a predetermined time in the future.

In instances in which the image sequences 806 and numerical sequences 816 are being used for training, the data processing system may determine a training loss 854 for the predicted image (or data object) based on a difference between the predicted image and an expected image. The data processing system may train the image prediction model 800 based on the determined difference using back-propagation techniques to improve the accuracy of the image prediction model 800. Thus, the image prediction model 800 may continue to become more accurate over time as the diamond synthesis machine operates, accounting for any change in how the machine functions.

In summary, network architectures comprising units for long short-term memory networks (LSTMs) may encode numerical environment sequences into a 4,200-dimensional vector. For encoding the input image sequences, a special implementation of LSTMs may replace the dense units with convolutional layers to learn spatial characteristics (convolutional LSTMs). A series of convolutional LSTMs may encode information from image sequences to a 34,800-dimensional vector (from past states of diamond growth into a continuous mathematical entity) and merge it with a numerical sequence vector to obtain an input feature vector for the decoder network. This network may employ a series of convolutional two-dimensional transpose layers to up-sample the lower-dimensional encoder output into an output representing the diamond's state after a number of pre-defined time-steps into the future. The whole network may be trained to minimize the mean-squared loss between the pixels of the predicted image and an actual output image. Essentially, the encoder and decoder may be designed to identify characteristic spatial features and mathematically translate them on a sequential basis towards a future state based on vector information derived from past sequences.

By controlling the encoder output feature size and optimizing the loss function to having higher weights over diamond and pocket-holder contours (which may be obtained using a feature extraction machine learning model), prediction accuracies of ~99.99989% may be obtained with minimal information loss between predicted and actual outputs. This constitutes a never-before obtained result of a numerical, not simulation-based, prediction of diamond shape from data obtained during a growth run, and demonstrates in-situ growth state prediction based on inputs from data collected during earlier growth states.

In one embodiment, a method comprises using segmentation or feature extraction models based on deep-learning (AI) to isolate features of optical images taken in a reactor (e.g., a diamond synthesis machine; using a frame prediction model based on deep-learning (AI) with high dimensional and heterogenous past state parameters, including images and reactor long parameters to (1) predict future growth states, and (2) use predicted growth states to analyze time-separated evolution of features extracted from growth states; and simulating learned representations from image segmentation or feature extraction and frame prediction models to find parameters for defect free and optimal diamond crystal growth.

In another embodiment, a software system may comprise computer implemented Deep-learning or AI based algorithms that are used to isolate and analyze features from optical images taken in the reactor; predict future growth states from reactor logs and images taken during diamond growth; analyze time-separated evolution of features extracted from growth states; and simulate learned representations from models to detect parameters for defect free and optimal diamond crystal growth. The software implemented architecture may include streaming capabilities that can be used for syncing data between the crystal synthesis reactor and development environment for training AI models. The software implemented architecture may include a database architecture that is capable of handling unstructured data that can be used for storing all datasets and model files. A computer may comprise one or more Graphics Processing Units (GPUs) that can be used to train one or more of the AI based algorithms or models. One or a combination of CPUs and GPUs may be used for testing/ evaluation of the trained models. Dashboards may be provided on a user interface for the perusal of manufacturing scientists. The dashboards may be developed and iteratively updated with analytics on results from the AI models.

Overall, the systems and methods described herein provide for an AI/Deep Learning-based pipeline comprising algorithms for understanding, predicting and optimizing diamond crystal growth. One aspect of the pipeline is an algorithm using image segmentation or feature extraction models based on deep-learning (AI) to isolate features of optical images taken in the reactor. The other aspect of the pipeline is an algorithm using a frame prediction model based on deep-learning (AI) with high dimensional and heterogenous past state parameters, including images and reactor long parameters to predict future growth states and use predicted growth states to analyze time-separated evolution of features extracted from growth states using the feature extraction model. Yet another aspect of the pipeline is being able to simulate learned representations from image segmentation or feature extraction and frame prediction models to find parameters for defect-free and optimal diamond crystal growth.

The pipeline provided may be a binding unit within a software system modeled to develop and integrate the above-mentioned deep-learning or AI-based algorithms. One aspect of the software system is a software-implemented architecture with streaming capabilities that can be used for syncing data between the crystal synthesis reactor and development environment for training AI models. The other aspect of the software system can be a software-implemented database architecture capable of handling unstructured data is used for storing all datasets and model files. Another aspect of the software system is a computing system comprising one or more GPUs used to train AI models and either one or a combination of CPUs and GPUs are used for testing/evaluation of trained AI models. Yet another aspect includes dashboards for the perusal of manufacturing scientists that are developed and iteratively updated with analytics on results from AI models.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What we claim is:

1. A method for synthesizing a crystal using a synthesis machine, comprising:
receiving, by a processor, a plurality of images of a crystal during synthesis within a synthesis machine, the plurality of images captured;
generating, by the processor, a data object based on the plurality of images, the data object indicating a predicted state of the crystal within the synthesis machine at a time subsequent to the capture of the plurality of images;

detecting, by the processor, a predicted defect in the crystal based on the predicted state of the crystal; and adjusting, by the processor, operation of the synthesis machine responsive to detecting the defect.

2. The method of claim 1, wherein the predicted defect comprises an improper shape, an improper size, or a crystallographic defect.

3. The method of claim 1, wherein the data object comprises a predicted image depicting the crystal in the predicted state, and wherein the predicted image comprises a plurality of pixels, the method further comprising:

extracting, by the processor, a plurality of classification labels for the plurality of pixels of the predicted image, wherein detecting the predicted defect in predicted state of the crystal comprises detecting, by the processor, the predicted defect based on the plurality of classification labels.

4. The method of claim 3, wherein extracting the plurality of classification labels comprises extracting, by the processor, classification labels indicating a side of the crystal, a type of object, or a type of defect for the plurality of pixels of the predicted image.

5. The method of claim 1, wherein generating the data object comprises generating, by the processor, the data object based on the plurality of images and a schedule of operating parameters of the synthesis machine to obtain the predicted data object, the schedule of operating parameters of the synthesis machine corresponding to times in which the plurality of images were captured.

6. The method of claim 5, wherein the schedule of operating parameters further comprises a first set of operating parameters for the synthesis machine for a first time between the capture of the plurality of images and the time subsequent to the capture of the plurality of images.

7. The method of claim 1, wherein generating the data object comprises:

converting, by the processor, the plurality of images into a multi-dimensional vector corresponding to a predicted first state of the crystal at a first time-step subsequent to the capture of the plurality of images; and generating, by the processor, the predicted data object based on the multi-dimensional vector.

8. The method of claim 1, wherein the data object comprises a predicted image depicting the crystal in the predicted state, and wherein detecting the predicted defect comprises:

evaluating, by the processor, a shape of the crystal depicted in the predicted image according to a set of crystal defect rules; and detecting, by the processor, a macroscopic defect, microscopic defect, a center defect, or an edge defect in the crystal responsive to determining the shape of the crystal satisfies a crystal defect rule.

9. The method of claim 1, further comprising:

receiving, by the processor, a second plurality of images of a second crystal during synthesis within the synthesis machine, each of the second plurality of images captured within a second time period;

generating, by the processor, a second data object based on the second plurality of images, the second predicted data object indicating a second predicted state of the second crystal within the synthesis machine at a second time subsequent to the second time period;

determining, by the processor, there are not any defects in the crystal in the second predicted state; and generating, by the processor, a record indicating no defects were detected in the crystal in the second predicted state.

10. The method of claim 1, wherein adjusting operation of the synthesis machine comprises adjusting, by the processor, a pressure or a temperature of the synthesis machine.

11. The method of claim 1, wherein the predicted data object comprises a predicted image depicting the crystal in the predicted state, and wherein detecting the predicted defect in the crystal depicted in the predicted image comprises:

identifying, by the processor, a contour of the predicted defect from the predicted image; and detecting, by the processor, the predicted defect in response to identifying the contour.

12. The method of claim 1, wherein the data object comprises a predicted image depicting the crystal in the predicted state, and wherein detecting the predicted defect in the crystal depicted in the predicted image comprises:

identifying, by the processor, a contour of the crystal or a crystal holder based on the predicted image;

identifying, by the processor, a size or shape of the crystal based on the contour; and detecting, by the processor, the predicted defect in response to identifying the size or shape.

13. The method of claim 1, wherein the image comprises an optical image or a thermal image.

14. A system for synthesizing a crystal using a synthesis machine, the system comprising:

a processor configured to execute instructions stored on a non-transitory computer-readable medium to:

receive a plurality of images of a crystal during synthesis within a synthesis machine, the plurality of images captured;

generate a data object based on the plurality of images, the data object indicating a predicted state of the crystal within the synthesis machine at a time subsequent to the capture of the plurality of images;

detect a predicted defect in the crystal based on the predicted state of the crystal; and adjust operation of the synthesis machine responsive to detecting the defect.

15. The system of claim 14, wherein the predicted data object comprises a predicted image depicting the crystal in the predicted state, wherein the predicted image comprises a plurality of pixels, and wherein the processor is further configured to:

extract a plurality of classification labels for the plurality of pixels for the predicted image, wherein the processor is configured to detect the predicted defect in the crystal based on the plurality of classification labels for the plurality of pixels.

16. The system of claim 15, wherein the processor is configured to extract the plurality of classification labels by extracting classification labels indicating a side of the crystal, a type of object, or a type of defect for the plurality of pixels of the predicted image.

17. The system of claim 14, wherein the processor is configured to generate the data object by generating the data object based on the plurality of images and a schedule of operating parameters of the synthesis machine to obtain the predicted data object, the schedule of operating parameters of the synthesis machine corresponding to times in which the plurality of images were captured.

18. The system of claim 17, wherein the schedule of operating parameters further comprises a first set of operating parameters for the synthesis machine for a first time between the capture of the plurality of images and the time subsequent to the capture of the plurality of images.

19. The system of claim 14, wherein the processor is configured to generate the data object by:
converting the plurality of images into a multi-dimensional vector corresponding to a predicted first state of the crystal at a first time-step subsequent to the capture of the plurality of images; and
generating the predicted data object based on the multi-dimensional vector.

20. The system of claim 14, wherein the data object comprises a predicted image depicting the crystal in the predicted state, and wherein the processor is configured to detect the predicted defect by:
evaluating a shape of the crystal depicted in the predicted image according to a set of crystal defect rules; and
detecting a macroscopic defect, microscopic defect, a center defect, or an edge defect in the crystal responsive to determining the shape of the crystal satisfies a crystal defect rule.

\* \* \* \* \*